United States Patent
Shen et al.

(10) Patent No.: US 9,218,032 B2
(45) Date of Patent: Dec. 22, 2015

(54) APPARATUS AND METHOD FOR CHARGING A MOBILE DEVICE

(75) Inventors: Jian Shen, San Diego, CA (US);
Tongzeng Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 575 days.

(21) Appl. No.: 13/571,212

(22) Filed: Aug. 9, 2012

(65) Prior Publication Data

US 2014/0042873 A1    Feb. 13, 2014

(51) Int. Cl.
| | |
|---|---|
| *H01L 41/113* | (2006.01) |
| *G06F 1/26* | (2006.01) |
| *H02N 2/18* | (2006.01) |
| *G06F 1/16* | (2006.01) |
| *H02J 7/32* | (2006.01) |

(52) U.S. Cl.
CPC .............. *G06F 1/26* (2013.01); *G06F 1/1684* (2013.01); *H01L 41/113* (2013.01); *H02J 7/32* (2013.01); *H02N 2/18* (2013.01); *H02N 2/181* (2013.01); *Y02B 40/90* (2013.01)

(58) Field of Classification Search
CPC ......... H02N 2/18; H02N 2/181; H02N 2/183; H02N 2/186
USPC ....................................................... 310/339
See application file for complete search history.

(56) References Cited

U.S. PATENT DOCUMENTS

| | | | | |
|---|---|---|---|---|
| 6,876,135 B2 * | 4/2005 | Pelrine et al. ................. | 310/339 |
| 7,170,201 B2 * | 1/2007 | Hamel et al. .................. | 307/151 |
| 7,791,893 B2 | 9/2010 | Champion et al. | |
| 8,536,765 B2 * | 9/2013 | Oh et al. ....................... | 310/328 |
| 8,664,833 B2 * | 3/2014 | Ko et al. ....................... | 310/328 |
| 8,686,620 B2 * | 4/2014 | Hayamizu ..................... | 310/339 |
| 8,704,427 B2 * | 4/2014 | Futter et al. ................... | 310/339 |
| 2002/0190610 A1 * | 12/2002 | Andre et al. .................. | 310/339 |
| 2004/0085002 A1 * | 5/2004 | Pearce .......................... | 310/339 |
| 2005/0174322 A1 * | 8/2005 | Orr .............................. | 345/156 |
| 2006/0063522 A1 * | 3/2006 | McFarland ................... | 455/423 |
| 2007/0257634 A1 | 11/2007 | Leschin et al. | |
| 2010/0253632 A1 * | 10/2010 | Chen et al. .................... | 345/169 |
| 2010/0277126 A1 * | 11/2010 | Naeimi et al. ................ | 320/137 |
| 2011/0109201 A1 * | 5/2011 | Ozawa et al. ................. | 310/339 |
| 2011/0136466 A1 * | 6/2011 | Pan ............................. | 455/404.2 |

(Continued)

FOREIGN PATENT DOCUMENTS

| | | |
|---|---|---|
| CN | 201928319 U | 8/2011 |
| GB | 2389719 A | 12/2003 |

OTHER PUBLICATIONS

Flynn, et al., "Fundamental limits on energy transfer and circuit considerations for piezoelectric transformers," IEEE Transactions on Power Electronics, vol. 17, No. 1, Jan. 2002, pp. 8-14.

*Primary Examiner* — Thomas Dougherty
(74) *Attorney, Agent, or Firm* — James Gutierrez

(57) ABSTRACT

An apparatus, a method, and a computer program product are provided. The apparatus may be a mobile device. The mobile device receives a first mechanical force applied to at least one region on the mobile device, performs a function unrelated to energy conversion in response to the first mechanical force, receives a second mechanical force applied to the at least one region on the mobile device, converts the second mechanical force into electrical energy using at least one piezoelectric element, and powers at least one component of the mobile device using the electrical energy.

28 Claims, 10 Drawing Sheets

(56) References Cited

U.S. PATENT DOCUMENTS

| | | |
|---|---|---|
| 2012/0068827 A1 | 3/2012 | Yi et al. |
| 2012/0146584 A1* | 6/2012 | Klinghult ............... 320/114 |
| 2013/0163189 A1* | 6/2013 | Tudosoiu ............ 361/679.46 |
| 2013/0188341 A1* | 7/2013 | Tseng et al. ............ 362/183 |

* cited by examiner

APPARATUS AND METHOD FOR CHARGING A MOBILE DEVICE

BACKGROUND

1. Field

The present disclosure relates generally to mobile devices, and more particularly, to an apparatus and method for charging mobile devices.

2. Background

Mobile devices typically have limited battery life. Improving such limited battery life presents difficult challenges, especially in high performance mobile devices, such as smartphones and tablet devices. Various techniques for improving the limited battery life of mobile devices have been implemented. For example, mobile devices have been configured to use an extended battery, which may be connected to the mobile device or a skin or cover of the mobile device. However, such configurations add weight and bulk to the mobile devices. As another example, mobile devices have been configured to use a hand crank or a built-in dynamo, however, such configurations also add weight and bulk to the mobile devices and are not efficient in charging a power supply of the mobile devices. As another example, mobile devices have been configured to use an external charging device which may not be available at various places and/or at various times. As yet another example, mobile devices have been configured to implement wireless charging technology, however, the adoption and accessibility of such technology still remains to be seen.

It should be noted that most mobile phone chargers are actually power adapters that provide a power source for charging circuitry, which is typically contained within the mobile phone. Mobile phones can usually accept a relatively wide range of voltages, as long as the voltage is sufficiently above the mobile phone battery's voltage. However, if the voltage is too high, it can damage the mobile phone. Generally, the voltage is 5.0 volts or slightly higher, but it can sometimes vary up to 12.0 volts when the power source is not loaded. There are also human-powered chargers sold on the market, which typically consist of a dynamo powered by a hand crank and an extension cord. Solar power chargers are also available. However, these solutions are not convenient or practical with respect to mobile devices.

SUMMARY

In an aspect of the disclosure, an apparatus, a method, and a computer program product are provided. The apparatus may be a mobile device, such as a mobile phone, a tablet device, or a sensor device deployed in a field. The mobile device receives a first mechanical force applied to at least one region on the mobile device, performs a function unrelated to energy conversion in response to the first mechanical force, receives a second mechanical force applied to the at least one region on the mobile device, converts the second mechanical force into electrical energy using at least one piezoelectric element, and powers at least one component of the mobile device using the electrical energy.

DETAILED DESCRIPTION

Figure 1:
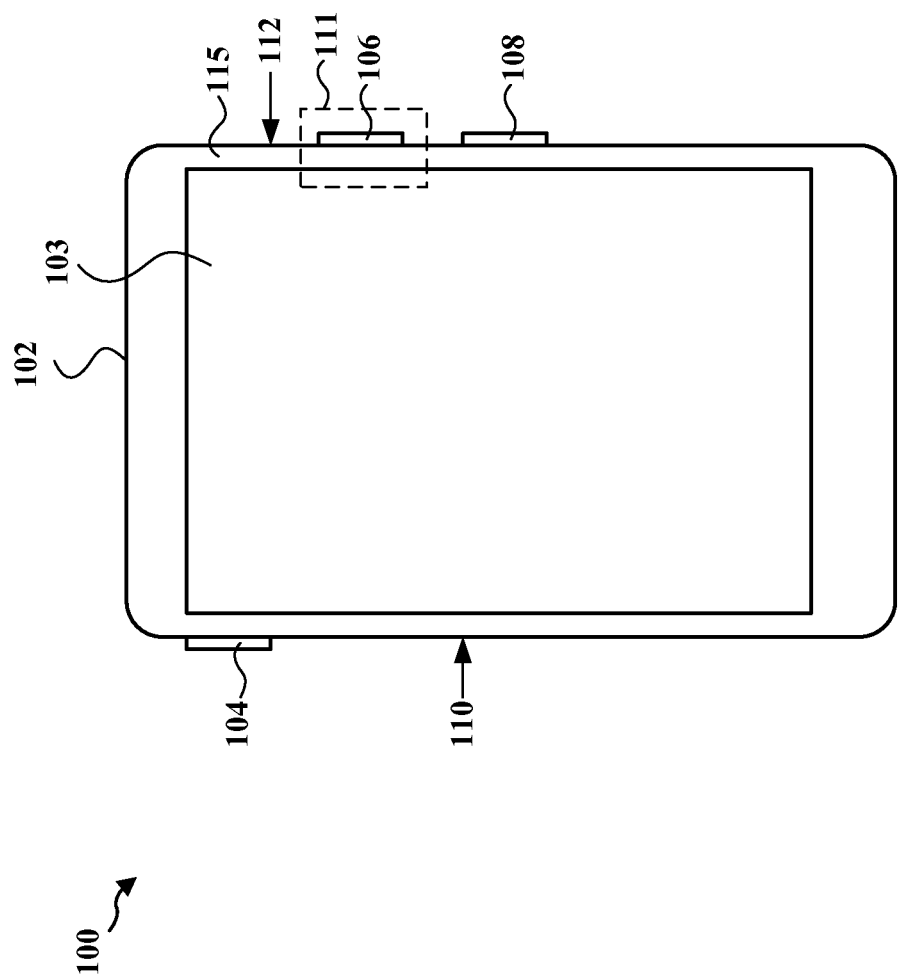
FIG. 1 is a diagram illustrating a front view of a mobile device.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of charging mobile devices will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

FIG. 1 is a diagram 100 illustrating a front view of a mobile device 102. For example, the mobile device 102 may be a cellular telephone, a personal digital assistant (PDA), a portable media player, or a sensor device deployed in a field. As shown in FIG. 1, the mobile device 102 includes a display 103, button 104 situated on side 110, buttons 106 and 108 situated on side 112, and a case 115. Each of the buttons 104, 106, and 108 may be configured to perform one or more functions of the mobile device 102. For example, button 104 may be configured to initiate a sleep mode of the mobile device 102, button 106 may be configured to increase the volume of the mobile device 102, and button 108 may be configured to decrease the volume of the mobile device 102. In one aspect, the buttons 104, 106, and 108 may be tactile buttons.

Figure 2:
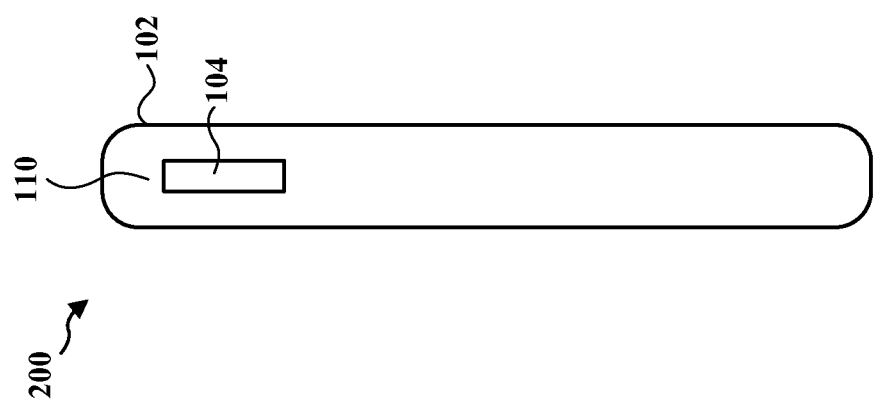
FIG. 2 is a diagram illustrating a view of a side of a mobile device.

FIG. 2 is a diagram 200 illustrating a view of side 110 of the mobile device 102. As shown in FIG. 2, button 104 is positioned in an upper region on side 110 of the mobile device 102. It should be understood, however, that button 104 may be positioned in any region on side 110 of mobile device 102 in other aspects.

Figure 3:
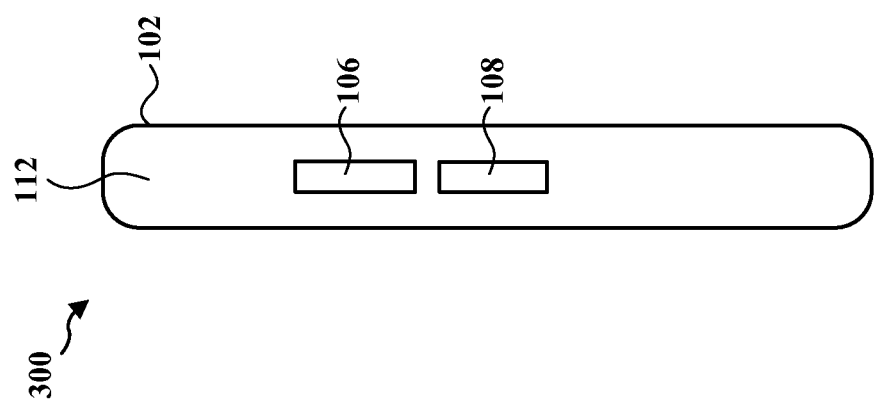
FIG. 3 is a diagram illustrating a view of a side of a mobile device.

FIG. 3 is a diagram 300 illustrating a view of side 112 of the mobile device 102. As shown in FIG. 3, buttons 106 and 108 are positioned in a central region on side 112 of the mobile device 102. It should be understood, however, that buttons 106 and 108 may be positioned in any region on side 112 of mobile device 102 in other aspects.

One or more of the buttons 104, 106, and 108 may be configured to receive a mechanical force and to transfer the mechanical force to a piezoelectric element. A piezoelectric element generates a voltage is response to an applied pressure. In one aspect, the piezoelectric element may be lead zirconate titanate (also referred to as "PZT"). Therefore, as a user of the mobile device 102 presses one or more of buttons 104, 106, and 108, the mechanical force applied by each press may be harvested by converting the mechanical force to electrical energy.

Figure 4:
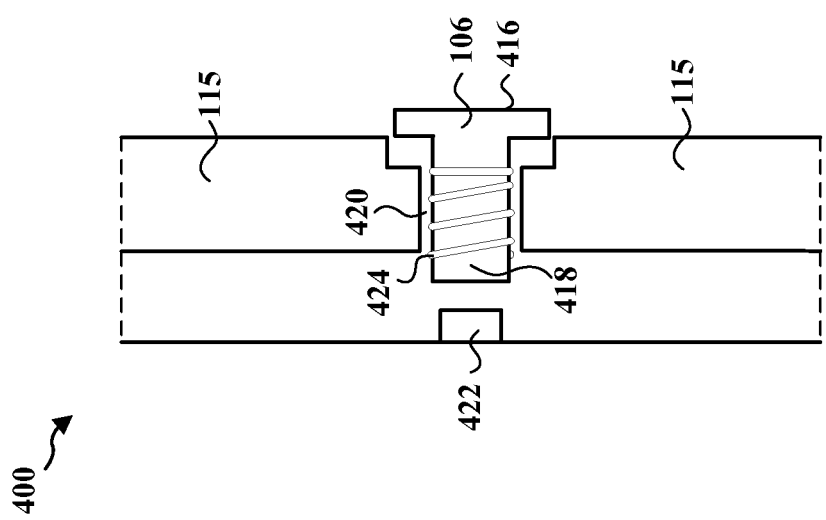
FIG. 4 is a diagram illustrating a cross sectional view of a mobile device.

FIG. 4 is a diagram 400 illustrating a cross sectional view of the mobile device 102 at region 111 indicated in FIG. 1. In the configuration of FIG. 4, button 106 includes a pressing surface 416 and a shaft 418. As shown in FIG. 4, the shaft 418 is configured to move through opening 420 in the case 115 when the button 106 is pressed. In one aspect, a spring 424 may be attached to the button 106 to allow the button 106 to return to its original position after being released. As shown in FIG. 4, a piezoelectric element 422 may be situated in the mobile device 102. When the button 106 is pressed, the shaft 418 is configured to transfer the force applied to the button 106 to the piezoelectric element 422, as shown in FIG. 5.

Figure 5:
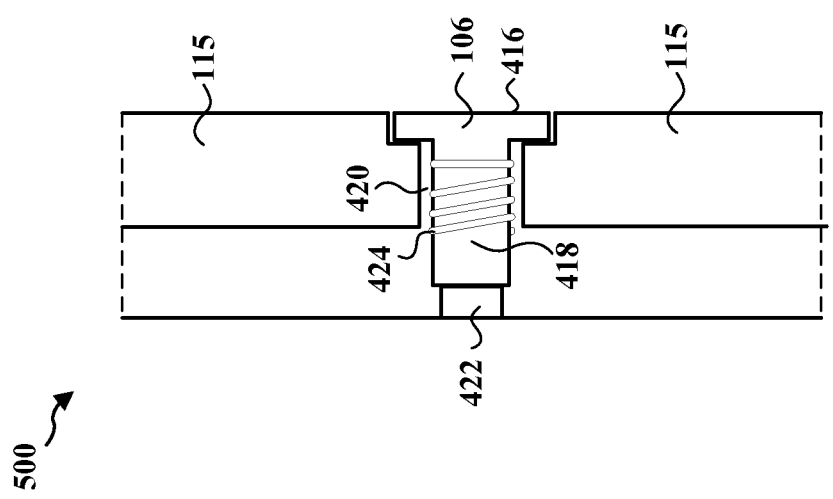
FIG. 5 is a diagram illustrating a cross-sectional view of a mobile device.

FIG. 5 is a diagram 500 illustrating a cross-sectional view of the mobile device 102 at region 111 indicated in FIG. 1. As shown in FIG. 5, the shaft 418 transfers the force applied to the button 106 to the piezoelectric element 422 when the button 106 is pressed, causing the piezoelectric element 422 to generate a voltage (i.e., converted electrical energy). The converted electrical energy from the piezoelectric element 422 may be provided to at least one electronic component of the mobile device 102 for use or storage, or to a power supply (not shown) of the mobile device 102. In one configuration, the converted electrical energy may be used to recharge the power supply of the mobile device. For example, the at least one electronic component may be a capacitor or a processor, and the power supply may be a battery. The basic circuitry and/or general electronic devices that may be attached to the piezoelectric element 422 for providing the converted electrical energy to the at least one component or power supply have been omitted in FIGS. 4 and 5 to avoid complexity in the drawings.

In the configuration of FIGS. 4 and 5, the piezoelectric element 422 has a rectangular shape. In other configurations, however, the piezoelectric element 422 may have a different shape.

Figure 6:
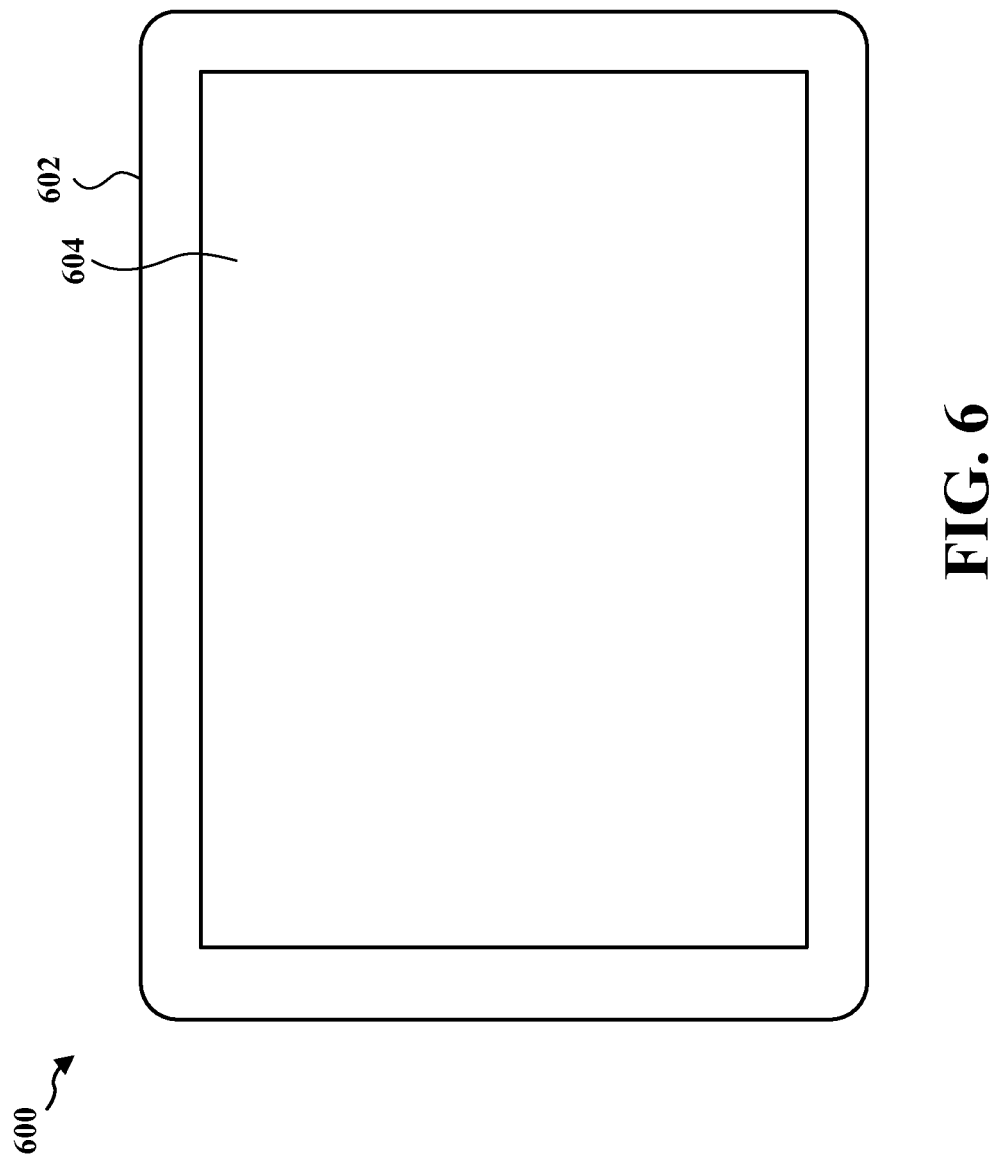
FIG. 6 is a diagram illustrating a front view of a mobile device.

FIG. 6 is a diagram 600 illustrating a front view of a mobile device 602. In the configuration of FIG. 6, the mobile device 602 is a tablet device that includes a touch screen 604.

Figure 7:
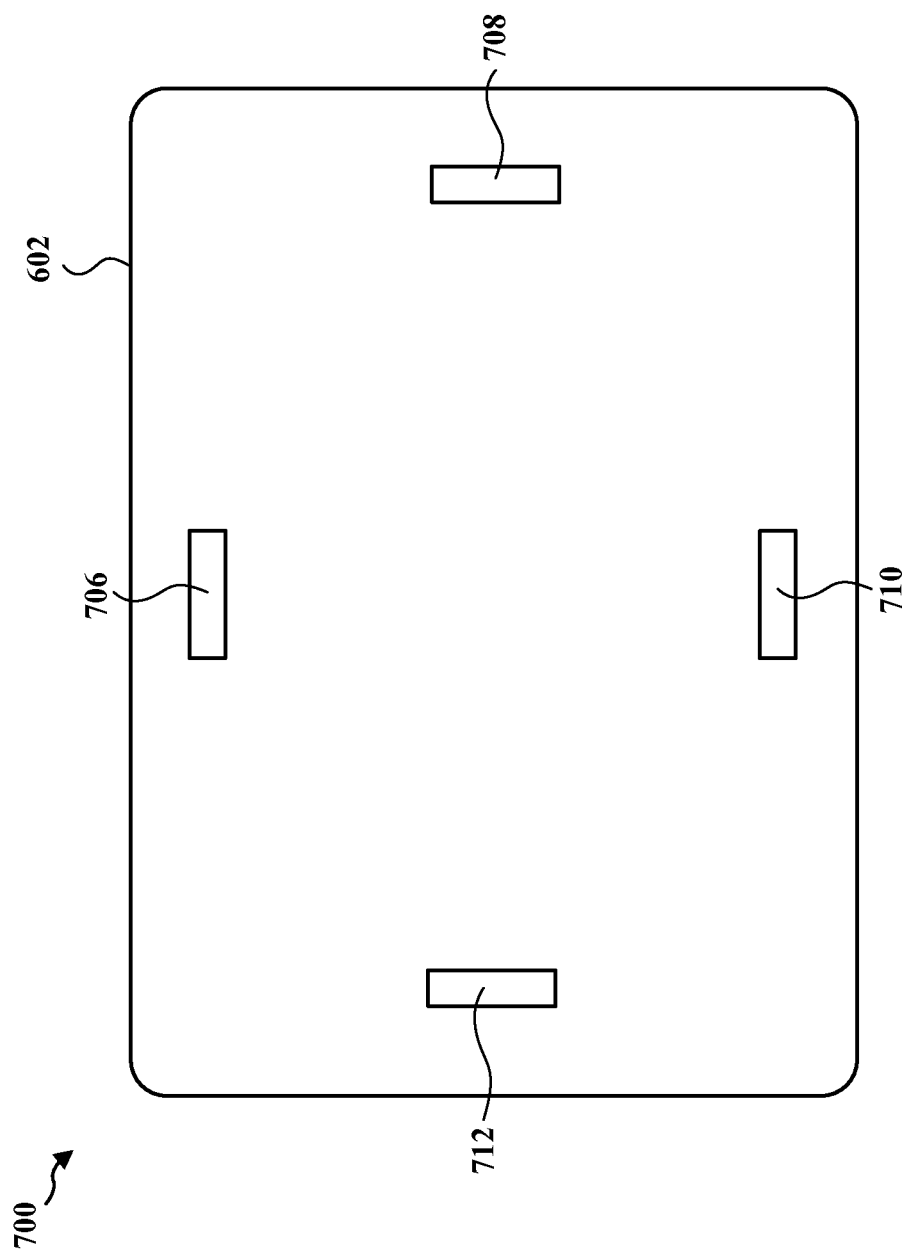
FIG. 7 is a diagram illustrating a rear view of a mobile device.

FIG. 7 is a diagram 700 illustrating a rear view of the mobile device 602. As shown in FIG. 7, the mobile device 602 includes buttons 706, 708, 710, and 712 situated near the edges of the mobile device 602. Each of the buttons 706, 708, 710, and 712 may be configured to perform one or more functions of the mobile device 602. For example, button 706 may be configured to turn on the mobile device 602, button 710 may be configured to initiate a sleep mode of the mobile device 602, button 708 may be configured to increase the volume of the mobile device 602, and button 712 may be configured to decrease the volume of the mobile device 602. In one aspect, the buttons 706, 708, 710, and 712 may be tactile buttons.

One or more of the buttons 706, 708, 710, and 712 may be configured to receive a mechanical force and to transfer the mechanical force to a piezoelectric element in a manner similar to buttons 104, 106, and 108 previously discussed with respect to mobile device 102. Therefore, as a user of the mobile device 602 presses one or more of buttons 706, 708, 710, and 712, the mechanical force applied by each press may be harvested by converting the mechanical force to electrical energy in a manner similar to the mobile device 102 as previously described.

Figure 8:
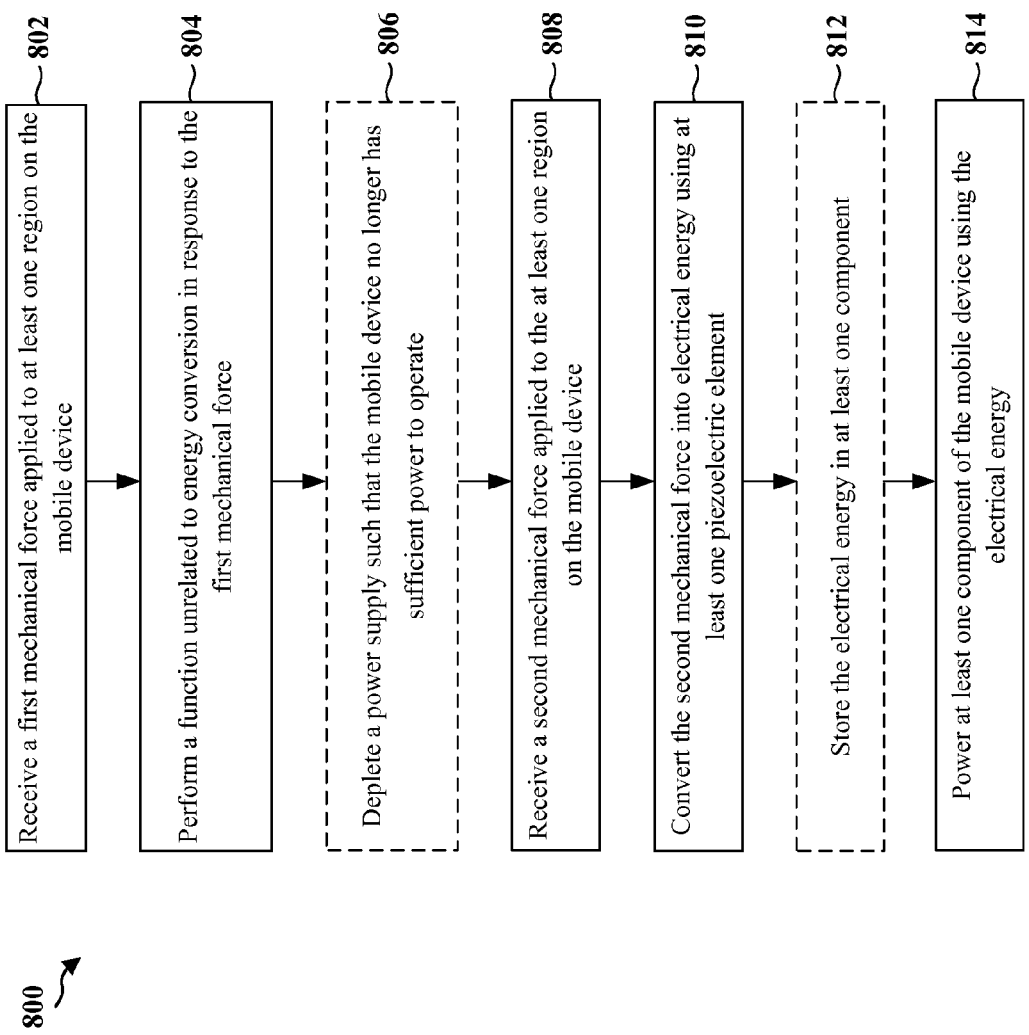
FIG. 8 is a flow chart of a method for a mobile device.

FIG. 8 is a flow chart 800 of a method for a mobile device. For example, the mobile device may be a mobile phone, a tablet device, or a sensor device deployed in a field.

At step 802, the mobile device, such as mobile device 102 in FIG. 1 or mobile device 602 in FIG. 7, receives a first mechanical force applied to at least one region on the mobile device. In one configuration, the at least one region may be at least one button including a shaft that is configured to move through an opening in a case of the mobile device, and the first mechanical force may be a force applied by a finger of a user when pressing the at least one button. For example, as shown in FIGS. 4 and 5, when the button 106 is pressed by a user, the shaft 418 of the button 106 may move through opening 420 in the case 115 of the mobile device 102.

At step 804, the mobile device performs a function unrelated to energy conversion in response to the first mechanical force. For example, in one configuration, the function unrelated to energy conversion may be a volume increase function of the mobile device. In other configurations, the function unrelated to energy conversion may be a volume decrease function or a sleep function of the mobile device.

At step 806, the mobile device depletes a power supply such that the mobile device no longer has sufficient power to operate. For example, the power supply may be depleted by operating the mobile device or maintaining a sleep mode of the mobile device without recharging the power supply of the mobile device.

At step 808, the mobile device receives a second mechanical force applied to the at least one region on the mobile device. In one configuration, the at least one region may be at least one button, such as the button 106 shown in FIG. 1.

At step 810, the mobile device converts the second mechanical force into electrical energy using at least one piezoelectric element. In one configuration, the second mechanical force may be a force applied by a finger of a user when pressing the at least one button, such as the button 106 of the mobile device 102. In such a configuration, the at least one button is configured to transfer the second mechanical force to the at least one piezoelectric element via the shaft. In one aspect, the function unrelated to energy conversion is not performed in response to the second mechanical force. In such aspect, the function unrelated to energy conversion may be disabled prior to receiving the second mechanical force. For example, as shown in FIGS. 4 and 5, the shaft 418 of button 106 may transfer the second mechanical force to the piezoelectric element 422. In one configuration, the piezoelectric element may be PZT and may have a rectangular shape.

At step 812, the mobile device may store the electrical energy in at least one component of the mobile device. For example, the electrical energy converted by the piezoelectric element 422 may be stored in a capacitor for later use.

At step 814, the mobile device may power at least one component of the mobile device using the electrical energy. For example, the at least one component may be a processor of the mobile device and/or recharging circuitry for a power supply of the mobile device.

Figure 9:
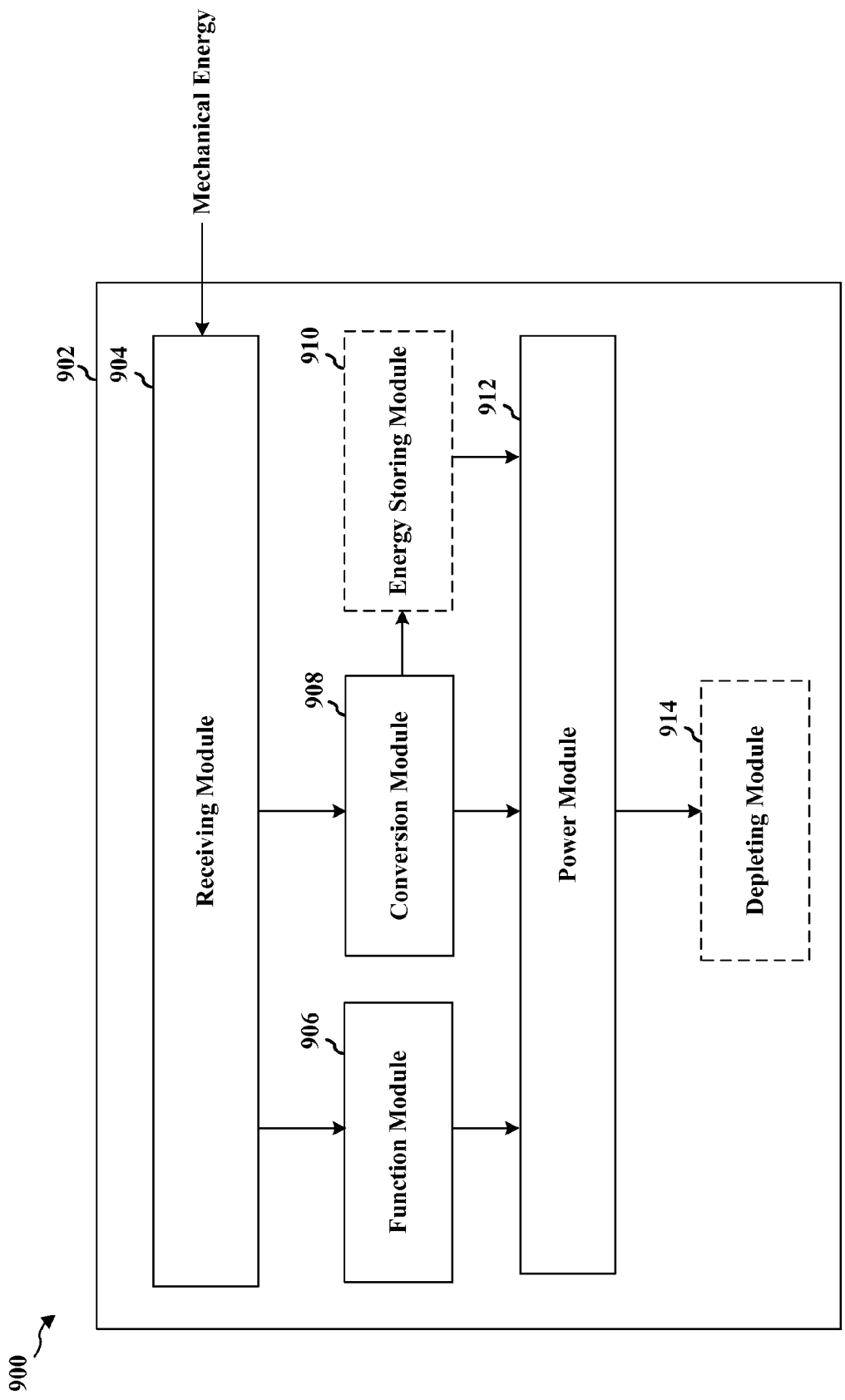
FIG. 9 is a conceptual flow diagram illustrating the operation of different modules/means/components in an exemplary apparatus.

FIG. 9 is a conceptual flow diagram 900 illustrating the operation of different modules/means/components in an exemplary apparatus 902. The apparatus may be a mobile device, a tablet device, or a sensor device deployed in a field. The apparatus 902 includes a receiving module 904, function module 906, conversion module 908, energy storing module 910, power module 912, and depleting module 914.

The receiving module 904 receives first and second mechanical forces applied to at least one region on the apparatus. For example, the receiving module may be a tactile button, such as button 106 shown in FIG. 1. The function module 906 performs a function unrelated to energy conversion in response to the first mechanical force. For example, the function module 906 may reduce or increase a volume of the apparatus. The conversion module 908 converts the second mechanical force into electrical energy using at least one piezoelectric element. For example, the piezoelectric element may be PZT. The energy storing module 910 stores the electrical energy in at least one component of the apparatus. For example, the energy storing module 910 may include at least one capacitor. The power module 912 powers at least one component of the apparatus using the electrical energy. The power module 912 may be a battery and the at least one component may be a processor, for example. The depleting module 914 depletes the power of the power module 912, such that the apparatus no longer has sufficient power to operate. For example, the depleting module 914 may be one or more components of the apparatus that draw power from the power module 912 during operation of the apparatus.

The apparatus may include additional modules that perform each of the steps in the aforementioned flow chart of FIG. 9. As such, each step in the aforementioned flow chart of FIG. 9 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 10:
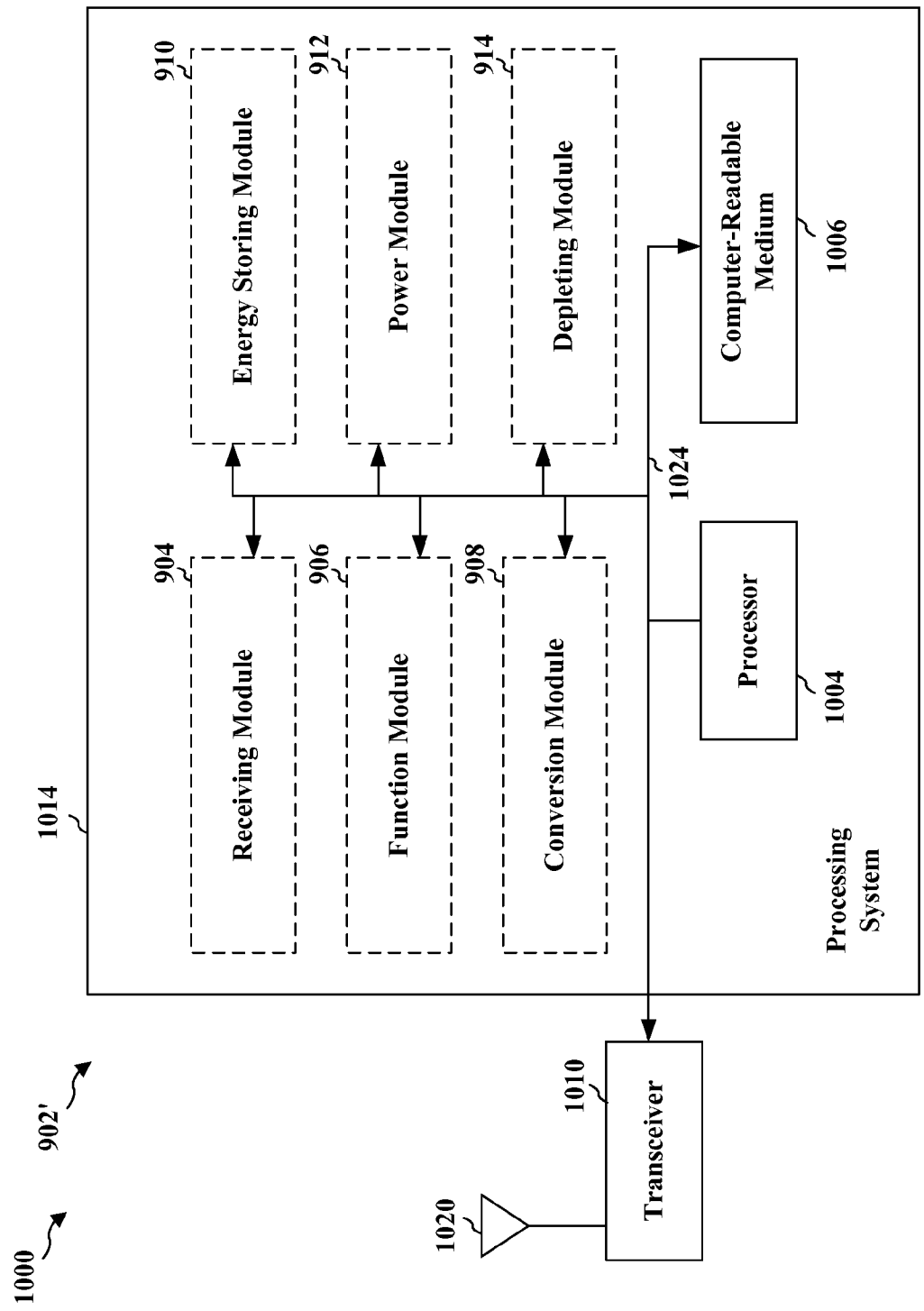
FIG. 10 is a diagram illustrating an example of a hardware implementation for an apparatus employing a processing system.

FIG. 10 is a diagram illustrating an example of a hardware implementation for an apparatus 902' employing a processing system 1014. The processing system 1014 may be implemented with a bus architecture, represented generally by the bus 1024. The bus 1024 may include any number of interconnecting buses and bridges depending on the specific application of the processing system 1014 and the overall design constraints. The bus 1024 links together various circuits including one or more processors and/or hardware modules, represented by the processor 1004, the modules 904, 906, 908, 910, 912, and 914, and the computer-readable medium 1006. The bus 1024 may also link various other circuits such as timing sources, peripherals, voltage regulators, and power management circuits, which are well known in the art, and therefore, will not be described any further.

The processing system 1014 may be coupled to a transceiver 1010. The transceiver 1010 is coupled to one or more antennas 1020. The transceiver 1010 provides a means for communicating with various other apparatus over a transmission medium. The processing system 1014 includes a processor 1004 coupled to a computer-readable medium 1006. The processor 1004 is responsible for general processing, including the execution of software stored on the computer-readable medium 1006. The software, when executed by the processor 1004, causes the processing system 1014 to perform the various functions described supra for any particular apparatus. The computer-readable medium 1006 may also be used for storing data that is manipulated by the processor 1004 when executing software. The processing system further includes at least one of the modules 904, 906, 908, 910, 912, and 914. The modules may be software modules running in the processor 1004, resident/stored in the computer readable medium 1006, one or more hardware modules coupled to the processor 1004, or some combination thereof.

In one configuration, the apparatus 902/902' includes means for receiving a first mechanical force applied to at least one region on the apparatus, means for performing a function unrelated to energy conversion in response to the first mechanical force, means for depleting a power supply such that the apparatus no longer has sufficient power to operate, means for receiving a second mechanical force applied to the at least one region on the apparatus, means for converting the second mechanical force into electrical energy using at least one piezoelectric element, means for storing the electrical energy in the at least one component, means for powering at least one component of the apparatus using the electrical energy. The aforementioned means may be one or more of the aforementioned modules of the apparatus 902 and/or the processing system 1014 of the apparatus 902' configured to perform the functions recited by the aforementioned means.

Therefore, due to the compact size of the piezoelectric element used in the mobile device, the configurations disclosed herein enable powering of the mobile device or charging a power supply of the mobile device without adding significant bulk or weight. Moreover, the configurations disclosed herein may be used to reduce the size of a power supply of the mobile device.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for a mobile device, the method comprising:
receiving a first mechanical force applied to at least one region on the mobile device;
performing a function unrelated to energy conversion in response to the first mechanical force;
disabling the function unrelated to energy conversion for the at least one region on the mobile device;
receiving a second mechanical force applied to the same at least one region on the mobile device;
converting the second mechanical force into electrical energy using at least one piezoelectric element without performing the function unrelated to energy conversion in response to the second mechanical force; and
powering at least one component of the mobile device using the electrical energy.

2. The method of claim 1, further comprising storing the electrical energy in the at least one component.

3. The method of claim 1, wherein:
the at least one region is at least one button comprising a shaft that is configured to move through an opening in a case of the mobile device; and
the at least one button is configured to transfer the second mechanical force to the at least one piezoelectric element via the shaft.

4. The method of claim 1, wherein the at least one piezoelectric element comprises lead zirconate titanate (PZT).

5. The method of claim 1, wherein the at least one piezoelectric element has a rectangular shape.

6. The method of claim 1, further comprising:
depleting a power supply such that the mobile device no longer has sufficient power to operate,
wherein the second mechanical force is received and converted into the electrical energy when the power supply is depleted.

7. The method of claim 1, wherein the mobile device is one of a mobile phone, a tablet device, and a sensor device deployed in a field.

8. An apparatus, the apparatus being a mobile device, comprising:
means for receiving a first mechanical force applied to at least one region on the mobile device;
means for performing a function unrelated to energy conversion in response to the first mechanical force;
means for disabling the function unrelated to energy conversion for the at least one region on the mobile device;
means for receiving a second mechanical force applied to the same at least one region on the mobile device;
means for converting the second mechanical force into electrical energy using at least one piezoelectric element without performing the function unrelated to energy conversion in response to the second mechanical force; and
means for powering at least one component of the mobile device using the electrical energy.

9. The apparatus of claim 8, further comprising means for storing the electrical energy in the at least one component.

10. The apparatus of claim 8, wherein:
the at least one region is at least one button comprising a shaft that is configured to move through an opening in a case of the mobile device; and
the at least one button is configured to transfer the second mechanical force to the at least one piezoelectric element via the shaft.

11. The apparatus of claim 8, wherein the at least one piezoelectric element comprises lead zirconate titanate (PZT).

12. The apparatus of claim 8, wherein the at least one piezoelectric element has a rectangular shape.

13. The apparatus of claim 8, further comprising:
means for depleting a power supply such that the mobile device no longer has sufficient power to operate,
wherein the second mechanical force is received and converted into the electrical energy when the power supply is depleted.

14. The apparatus of claim 8, wherein the mobile device is one of a mobile phone, a tablet device, and a sensor device deployed in a field.

15. An apparatus, the apparatus being a mobile device, comprising:
a memory; and
at least one processor coupled to the memory and configured to:
receive a first mechanical force applied to at least one region on the mobile device;
perform a function unrelated to energy conversion in response to the first mechanical force;
disable the function unrelated to energy conversion for the at least one region on the mobile device;
receive a second mechanical force applied to the same at least one region on the mobile device;
convert the second mechanical force into electrical energy using at least one piezoelectric element without performing the function unrelated to energy conversion in response to the second mechanical force; and
power at least one component of the mobile device using the electrical energy.

16. The apparatus of claim 15, wherein the at least one processor is further configured to store the electrical energy in the at least one component.

17. The apparatus of claim 15, wherein:
the at least one region is at least one button comprising a shaft that is configured to move through an opening in a case of the mobile device; and
the at least one button is configured to transfer the second mechanical force to the at least one piezoelectric element via the shaft.

18. The apparatus of claim 15, wherein the at least one piezoelectric element comprises lead zirconate titanate (PZT).

19. The apparatus of claim 15, wherein the at least one piezoelectric element has a rectangular shape.

20. The apparatus of claim 15, wherein the
at least one processor is further configured to:
deplete a power supply such that the mobile device no longer has sufficient power to operate,
wherein the second mechanical force is received and converted into the electrical energy when the power supply is depleted.

21. The apparatus of claim 15, wherein the mobile device is one of a mobile phone, a tablet device, and a sensor device deployed in a field.

22. A non-transitory computer-readable medium storing computer executable code for executing on a mobile device, comprising code for:
receiving a first mechanical force applied to at least one region on the mobile device;
performing a function unrelated to energy conversion in response to the first mechanical force;
disabling the function unrelated to energy conversion for the at least one region on the mobile device;
receiving a second mechanical force applied to the same at least one region on the mobile device;
converting the second mechanical force into electrical energy using at least one piezoelectric element without performing the function unrelated to energy conversion in response to the second mechanical force; and
powering at least one component of the mobile device using the electrical energy.

23. The non-transitory computer-readable medium of claim 22, further comprising code for storing the electrical energy in the at least one component.

24. The non-transitory computer-readable medium of claim 22, wherein:
the at least one region is at least one button comprising a shaft that is configured to move through an opening in a case of the mobile device; and
the at least one button is configured to transfer the second mechanical force to the at least one piezoelectric element via the shaft.

25. The non-transitory computer-readable medium of claim 22, wherein the at least one piezoelectric element comprises lead zirconate titanate (PZT).

26. The non-transitory computer-readable medium of claim 22, wherein the at least one piezoelectric element has a rectangular shape.

27. The non-transitory computer-readable medium of claim 22, further comprising code for:
depleting a power supply such that the mobile device no longer has sufficient power to operate,
wherein the second mechanical force is received and converted into the electrical energy when the power supply is depleted.

28. The non-transitory computer-readable medium of claim 22, wherein the mobile device is one of a mobile phone, a tablet device, and a sensor device deployed in a field.

\* \* \* \* \*